United States Patent
Mizusaki et al.

(10) Patent No.: US 7,432,525 B2
(45) Date of Patent: Oct. 7, 2008

(54) TRANSISTOR AND DISPLAY DEVICE INCLUDING THE TRANSISTOR

(75) Inventors: Masanobu Mizusaki, Tenri (JP); Motohiro Yamahara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 429 days.

(21) Appl. No.: 10/486,513

(22) PCT Filed: Dec. 24, 2002

(86) PCT No.: PCT/JP02/13469

§ 371 (c)(1),
(2), (4) Date: Feb. 12, 2004

(87) PCT Pub. No.: WO03/056640

PCT Pub. Date: Jul. 10, 2003

(65) Prior Publication Data

US 2004/0238814 A1    Dec. 2, 2004

(30) Foreign Application Priority Data

Dec. 25, 2001  (JP) .............................. 2001-391526

(51) Int. Cl.
   *H01L 21/84* (2006.01)
(52) U.S. Cl. .............................. 257/40; 257/59; 257/72; 257/E51.005
(58) Field of Classification Search .............. 202/87, 202/94, 101, 29, 50, 51, 90, 13, 40, 59, 22, 202/258, 443, 58; 257/40, 59, 72, E51.005, 257/E51.031, E51.041, E51.035, E51.036, 257/E51.044

See application file for complete search history.

(56) References Cited

U.S. PATENT DOCUMENTS

| | | | | |
|---|---|---|---|---|
| 5,153,681 | A | * 10/1992 | Kishimoto et al. | 257/288 |
| 5,500,537 | A | * 3/1996 | Tsumura et al. | 257/40 |
| 5,546,889 | A | 8/1996 | Wakita et al. | |
| 5,970,318 | A | 10/1999 | Choi et al. | |
| 6,011,274 | A | * 1/2000 | Gu et al. | 257/59 |
| 6,720,572 | B1 | * 4/2004 | Jackson et al. | 257/40 |
| 6,783,814 | B2 | * 8/2004 | Swager et al. | 428/11 |

(Continued)

FOREIGN PATENT DOCUMENTS

JP      63-076378    4/1988

(Continued)

OTHER PUBLICATIONS

David F. Eaton et al., "Guest-Host Molecular Ensembles for Nonlinear Optics", 10th International Conference on the Chemistry of the Organic Solid State, Vancouver, BC, Canada, Jul. 7-12, 1991, vol. 211, pp. 125-133, XP002240643 Molecular Crystals and Liquid Crystals, 1992, UK.

(Continued)

*Primary Examiner*—Thomas L. Dickey
*Assistant Examiner*—Fazli Erdem
(74) *Attorney, Agent, or Firm*—Keating & Bennett, LLP

(57) ABSTRACT

A transistor includes a first electrode, a second electrode, an organic layer provided between the first and second electrodes, and a third electrode for use to apply an electric field to the organic layer. The organic layer includes a polymer inclusion complex.

13 Claims, 12 Drawing Sheets

U.S. PATENT DOCUMENTS 6,806,505 B2 * 10/2004 Kojima et al. .................. 257/86
2002/0034656 A1 3/2002 Thompson et al.

FOREIGN PATENT DOCUMENTS

| JP | 63-130164 | 6/1988 |
| JP | 04-133351 | 5/1992 |
| WO | WO 00/70655 | 11/2000 |

OTHER PUBLICATIONS

Yen-Yi Lin, et al., "Pentacene-Based Organic Thin-film Transistors", IEEE Transactions on Electron Devices, vol. 44, No. 8, Aug. 1997, pp. 1325-1331.

Yasuo Wada et al., "Prospects and Problems of Single Molecule Information Devices", Jpn. J. Appl. Phys. vol. 39 (2000), pp. 3835-3849, Part 1, No. 7A, Jul. 2000.

Takumi Abe et al., "Insulated Molecular Wire Formed by Polyaniline and Molecular Nanotubes", Polymer Preprints, Japan, vol. 50, No. 12 (2001), p. 2980.

Takeshi Shimomura et al., "Molecular Coated Wire Consisting of Conductive Polymer and Molecular Nanotube", Polymer Preprints, Japan, vol. 50, No. 13 (2001), pp. 3265-3266 (Partial English translation included).

Official Communication dated Oct. 14, 2005, issued in the corresponding Korean Patent Application No. 10-2003-7014812.

* cited by examiner

TRANSISTOR AND DISPLAY DEVICE INCLUDING THE TRANSISTOR

BACKGROUND OF THE INVENTION

1. Field of the Invention

The present invention relates to a transistor and a display device including the transistor. More particularly, the present invention relates to a transistor having an organic layer as a semiconductor layer including a conductive polymer and also relates to a display device including such a transistor. As used herein, the term "conductive polymer" refers to a novel polymer that behaves as a conductor or a semiconductor.

2. Description of the Related Art

Recently, an active-matrix liquid crystal display device (LCD) that uses active components such as thin-film transistors (TFTs) as its switching elements has frequently been used as a monitor for notebook computers, desktop computers, workstations and so on, and in a liquid crystal television. This is because the active-matrix LCD can display an image having high quality, which is at least comparable to, or even better than, an image displayed on a CRT, while consuming lower power and occupying a smaller space than the CRT. Despite these advantages, the active-matrix LCD is still much more expensive than the CRT. Accordingly, in order for this type of display device to become even more popular, its price must be reduced.

Meanwhile, an active-matrix organic EL (electro-luminescence) display device has also been vigorously researched and developed recently. In the active-matrix organic EL display device, the light-emitting element thereof (i.e., an active-matrix organic light-emitting diode (OLED)) is driven by an active component. Thus, the active component for such an organic EL device also needs to be manufactured at a lower cost.

One of the proposed methods of reducing the manufacturing cost of the active-matrix LCD or organic EL device is the use of an organic field effect transistor (FET) or an organic thin-film transistor (TFT) as the active component. The organic FET or organic TFT includes an organic semiconductor thin film, which can be easily formed by a currently available thin-film deposition technique.

However, a plasma-enhanced chemical vapor deposition (CVD) system, which is often used today to form an insulating layer or a semiconductor layer for an amorphous silicon (a-Si) TFT or a polysilicon (p-Si) TFT, and a sputtering system for use to form electrodes for such a TFT are both expensive. Also, in a CVD process, the insulating or semiconductor layer needs to be deposited at a temperature as high as about 230° C. to about 350° C. Furthermore, the CVD or sputtering system normally requires frequent maintenance such as cleaning, thus resulting in a low throughput. In contrast, a coater or an inkjet printer for use in forming an organic FET, for example, is much less expensive, and requires much simpler maintenance, than the CVD or sputtering system. Also, the organic semiconductor thin film can be deposited at a far lower temperature than the conventional insulating or semiconductor layer formed by the CVD process. Accordingly, when an organic FET is used for a liquid crystal display device or an organic EL display device, significant cost reduction is expected.

An organic TFT normally includes a transparent substrate (e.g., a glass substrate), a gate electrode, a gate insulating film, a source electrode, a drain electrode and an organic semiconductor film. In the organic TFT, by changing the voltage to be applied to the gate electrode, the quantity of charge existing in the interface between the gate insulating film and the organic semiconductor film is adjusted and thereby the amount of current flowing from the source electrode into the drain electrode by way of the organic semiconductor film can be changed. In this manner, the organic TFT can be selectively turned ON or OFF, and is also referred to as an "organic FET".

For example, Yen-Yi Lin, David J. Gundlach, Shelby F. Nelson and Thomas N. Jackson disclosed in IEEE Transactions on Electronic Devices, Vol. 44, No. 8, p. 1325 (1997) that an organic TFT was formed using pentacene.

However, an organic semiconductor film formed of pentacene must be deposited by an evaporation process. Accordingly, to improve the characteristics of such a film, the film needs to be crystallized sufficiently. On the other hand, according to another proposed technique, a pentacene derivative is used as an alternative organic film material to make the resultant organic film soluble and patternable more easily. In order to deposit a thin film of a low-molecular-weight organic semiconductor material such as pentacene, an evaporation process must be performed. Thus, the organic TFT cannot be manufactured efficiently. Also, since such a material normally cannot be crystallized sufficiently, desired characteristics are not always achieved.

Furthermore, Japanese Laid-Open Publication No. 63-76378 discloses a method of fabricating an organic TFT by using polythiophene or a derivative thereof for its organic semiconductor film.

An organic semiconductor thin film made of polythiophene, a polythiophene derivative or a thiophene oligomer can be formed easily by an electrochemical polymerization process or a solution coating technique. That is to say, such an organic semiconductor is an easily patternable material. However, such a material is still under research and development, and the properties thereof are not yet completely satisfactory.

Generally speaking, many of the conventional conductive polymers are rigid, insoluble and infusible. Accordingly, to introduce or increase the fusibility or solubility, a polymer derivative or oligomer with additional side chains is sometimes used (see Japanese Laid-Open Publications Nos. 4-133351, 63-76378 and 5-110069, for example). However, when the side chains are introduced, the polymer chain will increase its flexibility excessively. Then, the glass transition point will be included within the operating temperature range. As a result, thermochromism will be created due to micro-Brownian motion, π electrons will increase their conjugate length, and the stability of characteristics against temperatures will decrease.

On the other hand, when an oligomer is used, the reliability of the conductive polymer adversely decreases. In addition, a material with the additional oligomer cannot ensure a sufficient mobility. Accordingly, to increase the mobility, either the degree of polymerization or the alignment property of the conductive organic compound should be increased. The alignment property of the conductive organic compound may be improved by additionally providing an alignment film as disclosed in Japanese Laid-Open Publication No. 7-206599, for example.

Furthermore, π conjugated polymers are easily affected and deteriorated by oxygen or water in the air.

As described above, the conventional organic TFTs exhibit insufficient electrical characteristics, lack in chemical stability, and have a short lifetime.

Recently, a polymer complex, which is obtained by complexing together either multiple dissimilar polymers or a high-molecular-weight compound and a low-molecular-weight compound through non-covalent interactions, has attracted much attention as a novel functional material in certain specific fields not related to transistor technology or display technology. For example, a polymer inclusion complex, including a conductive polymer as a guest molecule and cyclodextrin (CD, which is an insulating cyclic molecule) or a molecular nanotube, synthesized from cyclodextrin, as a host molecule, respectively, is expected to be applicable as a molecular conductor. See Abe et al., "Structure And Physical Properties Of Molecular Wire Consisting Of Polyaniline And Molecular Nanotube", Polymer Preprints, Japan, Vol. 50, No. 12 2980 (2001) and Shimomura et al., "Molecular Coated Wire Consisting Of Conductive Polymer And Molecular Nanotube", Polymer Preprints, Japan, Vol. 50, No. 13, 3265 (2001), for example. However, nobody has ever reported or suggested that an organic TFT or display device could or should be formed by using a semiconductor layer made of a polymer inclusion complex.

SUMMARY OF THE INVENTION

In order to overcome the problems described above, preferred embodiments of the present invention improve the characteristics and reliability of a transistor, greatly simplify and decrease the cost of the manufacturing process of a transistor, by forming in the transistor an organic layer of a polymer inclusion complex. Preferred embodiments of the present invention also provide a display device that includes such a novel transistor.

As will be described below, various preferred embodiments of the present invention provide a transistor and display device having greatly improved characteristics including very high carrier mobility, excellent On-Off ratio and current-voltage ratio, a greatly simplified manufacturing process, a much lower cost of manufacturing, an increased aperture ratio, increased luminance, increased contrast ratio, improved viewing angle, high stability, high reliability, high durability, and having a nanoscale organic TFT structure.

According to one preferred embodiment of the present invention, a transistor includes a first electrode, a second electrode, an organic layer which is provided between the first and second electrodes, and a third electrode for applying an electric field to the organic layer, wherein the organic layer includes a polymer inclusion complex.

It is preferred that the organic layer is an organic layer having a nanoscale dimension.

It is also preferable that the organic layer including the polymer inclusion complex includes a guest polymer having electrical conductivity included in a host molecule. The host molecule may have a polymer having a cross-linked structure and the at least one terminal of the guest polymer preferably includes a bulky terminal group arranged to stabilize a state in which the guest polymer is included in the host molecule.

The guest polymer may preferably have reactive terminal groups, wherein the reactive terminal groups of adjacent guest polymers are preferably bonded together.

In another preferred embodiment, the guest polymer may be a π conjugated polymer, and wherein the terminal group and the guest polymer form a π conjugated system.

Still further, the guest polymer may be a linear polymer and the host molecule may be a cylindrical host molecule, wherein the cylindrical host molecule is one of a low-molecular-weight compound and a high-molecular-weight compound.

In another preferred embodiment, the guest polymer preferably has a degree of polymerization that is at least 10 to 200.

The transistor according to various preferred embodiments of the present invention may be a field effect transistor having any of a bottom-gate arrangement, a top-gate arrangement and a planar arrangement.

The transistor according various preferred embodiments of the present invention described above may be provided in a display device according to another preferred embodiment of the present invention. Such a display device can be an flat panel display device such as a liquid crystal display device or an organic EL display device.

Such a display device preferably includes a substrate, a gate electrode, a source electrode, a drain electrode, an organic layer including a polymer inclusion complex.

The display device may also include a gate insulating layer which is arranged to cover the gate electrode and is disposed between the gate electrode and the source and drain electrodes. In this case, the source and drain electrodes are disposed on top of the organic layer. The organic layer may directly contact the source electrode and the drain electrode.

In another preferred embodiment of the present invention, no gate insulating layer is provided and the organic layer is disposed between the gate electrode and the source and drain electrodes. The organic layer may directly contact each of the gate electrode, the source electrode and the drain electrode.

According to yet another preferred embodiment of the present invention, a method of forming a thin film transistor includes the steps of providing a substrate and forming a thin film transistor on the substrate including the step of forming an organic layer including a polymer inclusion complex.

The step of forming an organic layer preferably includes the step of forming a film of the polymer inclusion complex by applying or printing a solution of the polymer inclusion complex on the substrate by one of a spin coating technique, a dip coating technique, a casting technique, a printing technique, a micro-patterning technique and an inkjet technique.

The method of forming a transistor also preferably includes the steps of forming a gate electrode, forming a source electrode and forming a drain electrode.

Also, the method may also include the step of forming a gate insulating layer on the gate electrode and wherein the organic layer is formed on the source electrode and the drain electrode.

If no insulating layer is formed between the gate electrode and the source and drain electrodes, the organic layer directly contacts each of the gate electrode, the source electrode and the drain electrode, and the organic layer covers the gate electrode, and the source electrode and the drain electrode are disposed on the organic layer.

The above described method of forming a transistor can also be applied to a method of forming a display device for manufacturing a flat panel display device such as a liquid crystal display device, an organic EL display device.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1A:
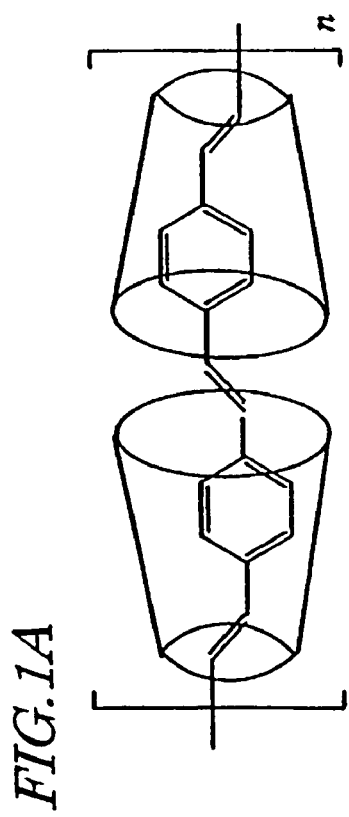
FIGS. 1A and 1B schematically illustrate the structures of two exemplary polymer inclusion complexes for use in a transistor according to a preferred embodiment of the present invention.

Hereinafter, preferred embodiments of the present invention will be described with reference to the accompanying drawings. First, a polymer inclusion complex as a material for an organic layer of a transistor will be described. The organic layer including a polymer inclusion complex may function as a semiconductor layer, or may function as a gate insulating layer as well as a semiconductor layer.

In general, a "polymer complex" is a complex of a number of molecules in which either multiple dissimilar polymers or a high-molecular-weight compound and a low-molecular-weight compound (including a metal complex) are bonded together via a particular intermolecular force (such as electrostatic interaction, hydrogen bond, charge transfer interaction, van der Waals force, hydrophobic interaction or coordinate bond). Also, each "polymer complex" has a particular composition and unique properties. See Yasuji Abe, "Polymer Complex", edited by The Society of Polymer Science, Japan, Kyoritsu Publisher, pp. 2-3, for example. Polymer complexes are classifiable into various types according to their shapes. Among other things, an inclusion complex is a typical one.

The "inclusion complex" means a complex in which a guest molecule has been caught or captured in a cavity that is formed by a host molecule. According to the cavity shapes of host molecules, the inclusion complexes are classifiable into cylinder types and basket types. In a preferred embodiment of the present invention, a linear polymer is preferably used as a guest polymer having electrical conductivity, and a cylindrical host molecule is preferably used as a host molecule. It should be noted that other types of polymers may be used as the guest polymer and the basket type cavity may be used as the host molecule.

The conductive guest polymer is preferably a linear π conjugated polymer with carrier conductivity. Examples of preferred π conjugated polymers include poly(p-phenylene), poly-p(phenylenevinylene), polythiophene, poly(methoxy-(ethyl-hexoxy)-phenylenevinylene), poly(dialkoxy-phenylenevinylene) and poly(naphthalenevinylene). Unlike the conductive polymer such as polyaniline, each of these π conjugated polymers does not cause the dissociation or association of protons so easily. Accordingly, none of these π conjugated polymers makes a transition from a conductor into an insulator so easily due to any external factor such as the pH of the electrolytic solution.

Examples of other preferred polymers include polystyrene sulfonates and poly(N-methyl-4-vinylpyridinium), each of which functions as a dopant for the π conjugated conductive polymer (e.g., polythiophene) and can increase the solubility thereof. Also, the polystyrene sulfonate has an excessively large or small quantity of charge, and can exchange the charge with the π conjugated polymer. In this manner, electrical conductivity can be imparted to the π conjugated polymer or the electrical conductivity of the π conjugated polymer can be increased.

The degree of polymerization of the conductive guest polymer is preferably at least 10 and more preferably at least 20. Generally speaking, the higher the degree of polymerization, the higher the stability and the electrical conductivity of the guest polymer. Nevertheless, the degree of polymerization should not exceed 200 because the solubility would decrease in that case.

The cylindrical host molecule may be either a low-molecular-weight compound or a high-molecular-weight compound. Examples of preferred host molecules include cyclodextrin, crown ether, calix arene, cyclic silazane, cyclic hemiacetal ester and derivatives thereof. Naturally, the polymers thereof may also be used. Among other things, cyclodextrin, a derivative thereof, and a polymer in which cyclodextrin molecules or derivatives thereof are cross-linked together are preferably used.

A preferred combination of a guest molecule and a host molecule should be selected such that the linear conductive guest molecule is included in the cavity of the cylindrical host molecule through a non-covalent interaction. It was confirmed via experiments that a cylindrical host molecule having a polar group externally and a hydrophobic cavity internally (such as a cyclodextrin molecule) would include various types of linear conductive polymers by itself. That is to say, the cylindrical host molecule and the linear conductive polymer form a sort of a self-organized structure. The number of chains of the linear conductive polymer(s) to be included in the host molecule is typically one or two but is not limited thereto.

When the linear conductive polymer is included in the cavity of the cylindrical host molecule, the movement of the linear conductive polymer is constrained and the conformation of the complex is limited. As a result, the carrier mobility increases along the chain of the linear conductive polymer. In addition, since the conformation is limited, the creation of the thermocromism due to the micro-Brownian movement is also minimized, thus increasing the thermal stability of the complex.

Furthermore, interaction between the cylindrical host molecules arranges the polymer inclusion complexes to be parallel or substantially parallel to each other. Then, the linear conductive polymers, included in the cavities of the cylindrical host molecules, are arranged substantially parallel or parallel to each other along the chains thereof. Consequently, in an organic layer made of the polymer inclusion complexes, the carrier mobility further increases along the chains of the linear conductive polymers.

Furthermore, the cylindrical host molecule normally has insulating properties, and therefore, hopping conduction between the linear conductive polymers, which are adjacent to each other vertically to the chains, is also minimized. Thus, the carrier mobility further increases along the chains of the linear polymers. Generally speaking, the conventional conductive polymer has a carrier mobility that is lower than that of a-Si or p-Si because the hopping conduction often occurs between the hopping sites of the conductive polymers. In contrast, according to this preferred embodiment of the present invention, a polymer inclusion complex is made up of the conductive polymer and the cylindrical host molecule, thereby minimizing the hopping conduction vertically to the chains. Consequently, the carrier mobility increases along the chains and the conductivity exhibits noticeable anisotropy. That is to say, the carriers can be utilized much more efficiently. It should be noted that the orientation directions of the polymer inclusion complexes are controllable by using the surface of a substrate that has been subjected to an alignment treatment. The alignment treatment may be a rubbing treatment to be performed on polyimide or polyphenylenevinylene. Other known alignment treatments may also be used.

The cylindrical host molecule may be either a low-molecular-weight compound or a high-molecular-weight compound. If a high-molecular-weight cylindrical host molecule is used, then the carrier mobility and the stability will increase. Alternatively, the linear conductive polymer may be included in the cavity of each of multiple low-molecular-weight cylindrical host molecules, and then the low-molecular-weight cylindrical host molecules may be polymerized with each other. Then, a polymer inclusion complex, in which the linear conductive polymers are included in the cavity of a high-molecular-weight cylindrical host molecule, can be obtained.

By using a cylindrical host molecule having a polar group outside of the molecule or by introducing a polar group into the outside of a cylindrical host molecule, the solubility of the complex in a polar solvent can be increased. That is to say, even when a linear conductive polymer is insoluble in a solvent by itself, a polymer inclusion complex, made up of the linear conductive polymer and a cylindrical host molecule, can be dissolved in the same solvent at a higher percentage. The polarity on the outside of the cylindrical host molecule is controllable through chemical modification. Likewise, the affinity of the linear conductive polymer for the cavity of the cylindrical host molecule is also controllable through chemical modification. It should be noted, however, that when a π conjugated polymer is used as the linear conductive polymer, the polymer chain is essentially hydrophobic. Accordingly, in that case, a host molecule having a hydrophobic cavity is preferably used without making any chemical modification to the π conjugated polymer. This is because if a chemical modification is introduced into the π conjugated polymer, then the polymer chain will increase its size too much to be included in the cavity of the cylindrical host molecule easily or the volume percentage of the functional portion relative to the overall polymer inclusion complex will decrease.

Furthermore, by including the linear conductive polymer in the cavity of the cylindrical host molecule, the linear conductive polymer can be protected from the external environment. That is to say, the conductive polymer that has been included in the hydrophobic cavity is protected from the water or oxygen in the air. Thus, the deterioration of the polymer due to oxidation, for example, is prevented and the lifetime thereof can be extended significantly.

A bulky terminal group is preferably introduced into at least one terminal of the linear conductive polymer. The reaction by which the linear conductive polymer is included in the cavity of the cylindrical host molecule is a sort of equilibrium reaction. Thus, the linear conductive polymer that has been once included in the cavity of the host molecule may be dissociated from the cavity. However, by introducing a bulky terminal group into the terminal of the linear conductive polymer, this dissociation can be prevented and the polymer inclusion complex can be stabilized. It is preferable to introduce two terminal groups into both terminals of the linear polymer. However, sufficient effects are achievable even if the terminal group is introduced into just one terminal of the linear polymer.

As used herein, the "bulky" terminal group refers to a terminal group that is big enough to prevent, or at least minimize, the dissociation of the linear conductive polymer from the cavity of the host molecule. Thus, the "bulkiness" is changeable depending on the size of the cavity or the structure of the linear conductive polymer. Suppose cyclodextrin is used as the host molecule. For example, if α-cyclodextrin having the smallest cavity size is used, even a terminal group having a single benzene ring would function as a cap sufficiently. On the other hand, when γ-cyclodextrin having the biggest cavity size is used, a terminal group having three or more benzene rings would serve as a cap.

Examples of preferred bulky terminal groups include compounds having unsaturated bonds such as perylene derivative>perylene>pyrene derivative>pyrene>phenanthrene derivative, anthracene derivative>phenanthrene, anthracene >naphthalene derivative>naphthalene (where > indicates the inequality in volume) Examples of preferred saturated compounds include cyclooctadecane>cyclotetradecane>cyclododecane>cyclodecane, adamantane.

Also, the terminal groups preferably have reactivity and are preferably bonded with each other. Particularly when a π conjugated polymer is used as the linear polymer, a compound having an unsaturated bond is preferably introduced as each of the terminal groups and the terminal groups are preferably bonded with each other. Then, the π conjugate length will increase, the number of terminals of the conductive polymers will decrease, and the number of hopping conduction sites will further decrease. As a result, the carrier mobility can be further increased along the chains of the conductive polymers. In addition, if terminal groups having unsaturated bonds are introduced, those terminal groups may be bonded with each other through a photo-reaction. It should be noted that the effects achieved by bonding the reactive terminal groups with each other and increasing the total molecular weight of the linear conductive polymers are achievable not just in bulky terminal groups but also in other terminal groups.

In a transistor according to a preferred embodiment of the present invention to be described below, a cyclodextrin compound (which may be a derivative or a cross-linked polymer thereof) is used as the host molecule and a π conjugated polymer is used as the conductive guest polymer.

First, a polymer inclusion complex that can be used effectively in an organic semiconductor layer of a transistor will be described.

A typical cyclodextrin molecule is a cyclic oligomer of glucose units as represented by the following Chemical Formula (1):

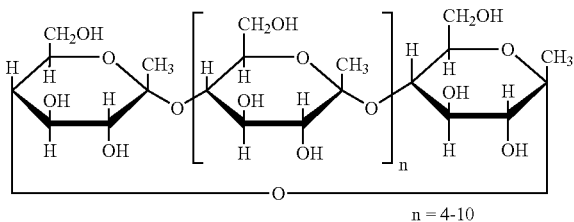

n = 4-10

The cavity size of a cyclodextrin molecule is changeable with the number of glucose units (in the range from 4 to 10). A cyclodextrin compound with high purity is easily available and allows for various chemical modifications.

According to their cavity sizes, cyclodextrin compounds are classifiable into α-cyclodextrin, β-cyclodextrin and γ-cyclodextrin compounds. The α-cyclodextrin compound has the smallest cavity and the γ-cyclodextrin compound has the largest cavity. Any of these cyclodextrin compounds of mutually different cavity sizes may be selectively used depending on the intended application or purpose.

A cyclodextrin molecule has a functional group with high polarity (such as a hydroxyl group) outside of the molecule. Accordingly, the cavity of the cyclodextrin molecule has low polarity and high hydrophobicity. Thus, the cyclodextrin molecule easily absorbs a highly hydrophobic compound such as the π conjugated polymer into its cavity to form an inclusion complex.

Also, due to the function of the polar group outside of the cyclodextrin molecule, the polymer inclusion complex is easy to dissolve in a polar solvent. Furthermore, the guest molecule that has been absorbed into the cavity of the cyclodextrin molecule has its movement constrained and the conformation of the polymer inclusion complex is limited. Consequently, the carrier mobility and the stability are significantly increased as described above. In addition, since the hopping conduction between adjacent conductive polymers is minimized, the carrier mobility further increases to provide very high carrier mobility.

Figure 1B:
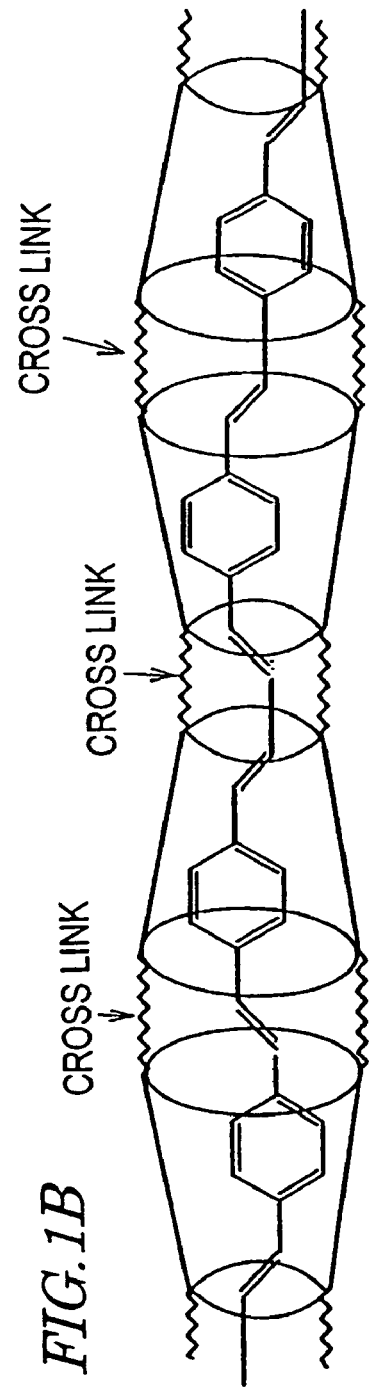

As schematically illustrated in FIGS. 1A and 1B, the cyclodextrin molecule includes a π conjugated conductive polymer. In the specific example shown in FIGS. 1A and 1B, the cyclodextrin molecule is illustrated as a cylinder.

The polymer inclusion complex shown in FIG. 1A has a structure in which a single linear conductive polymer extends through the cavities of multiple cyclodextrin molecules. The polymer inclusion complex shown in FIG. 1A includes a plurality of low-molecular-weight cyclodextrin molecules. Alternatively, as shown in FIG. 1B, the polymer inclusion complex may include a cross-linked cyclodextrin polymer in which adjacent cyclodextrin molecules are cross-linked with each other. A cyclodextrin polymer having such a cross-linked structure may be synthesized by the method disclosed in Japanese Laid-Open Publication No. 10-195108, for example. When a polymer inclusion complex including such a cross-linked cyclodextrin polymer is formed, the effects of increasing the carrier mobility and the stability are improved. It is possible to combine a low-molecular-weight cyclodextrin molecule with a cross-linked cyclodextrin polymer.

Figure 2A:
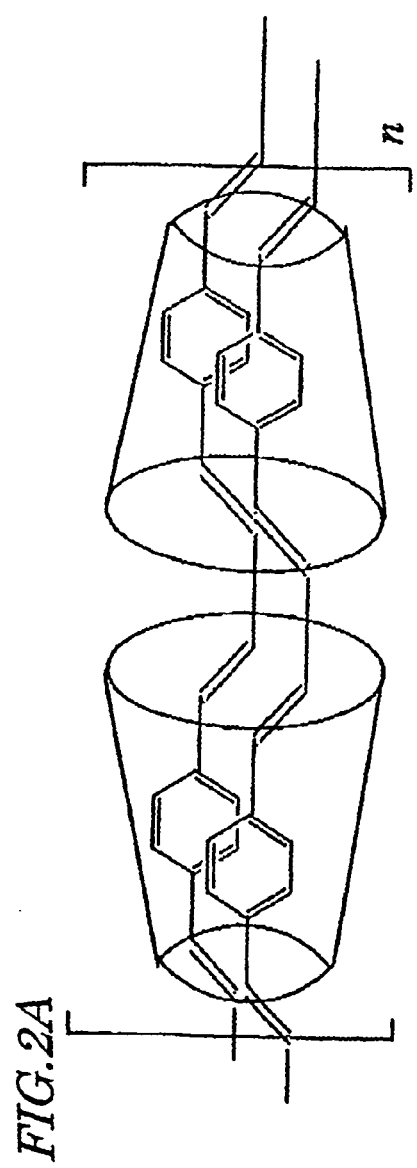
FIGS. 2A and 2B schematically illustrate the structures of two other exemplary polymer inclusion complexes for use in a transistor according to a preferred embodiment of the present invention.
Figure 2B:
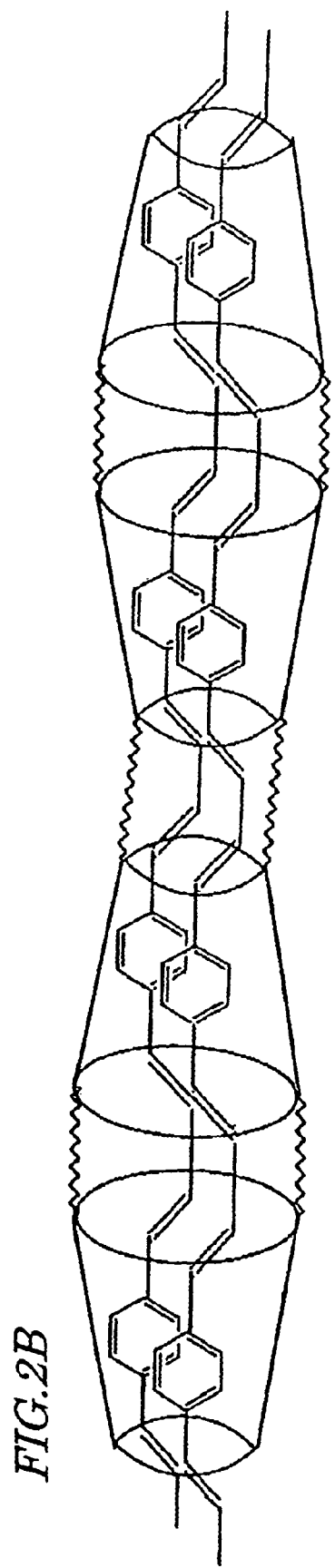

The cavity size of a cyclodextrin molecule changes with the number of glucose units. Accordingly, as shown in FIGS. 2A and 2B, the polymer inclusion complex may have a structure in which the two chains of two linear conductive polymers extend through the cavities of multiple cyclodextrin molecules. The conductive polymers to be included in the cyclodextrin molecules are typically of the same type but may be of mutually different types.

Figure 3:
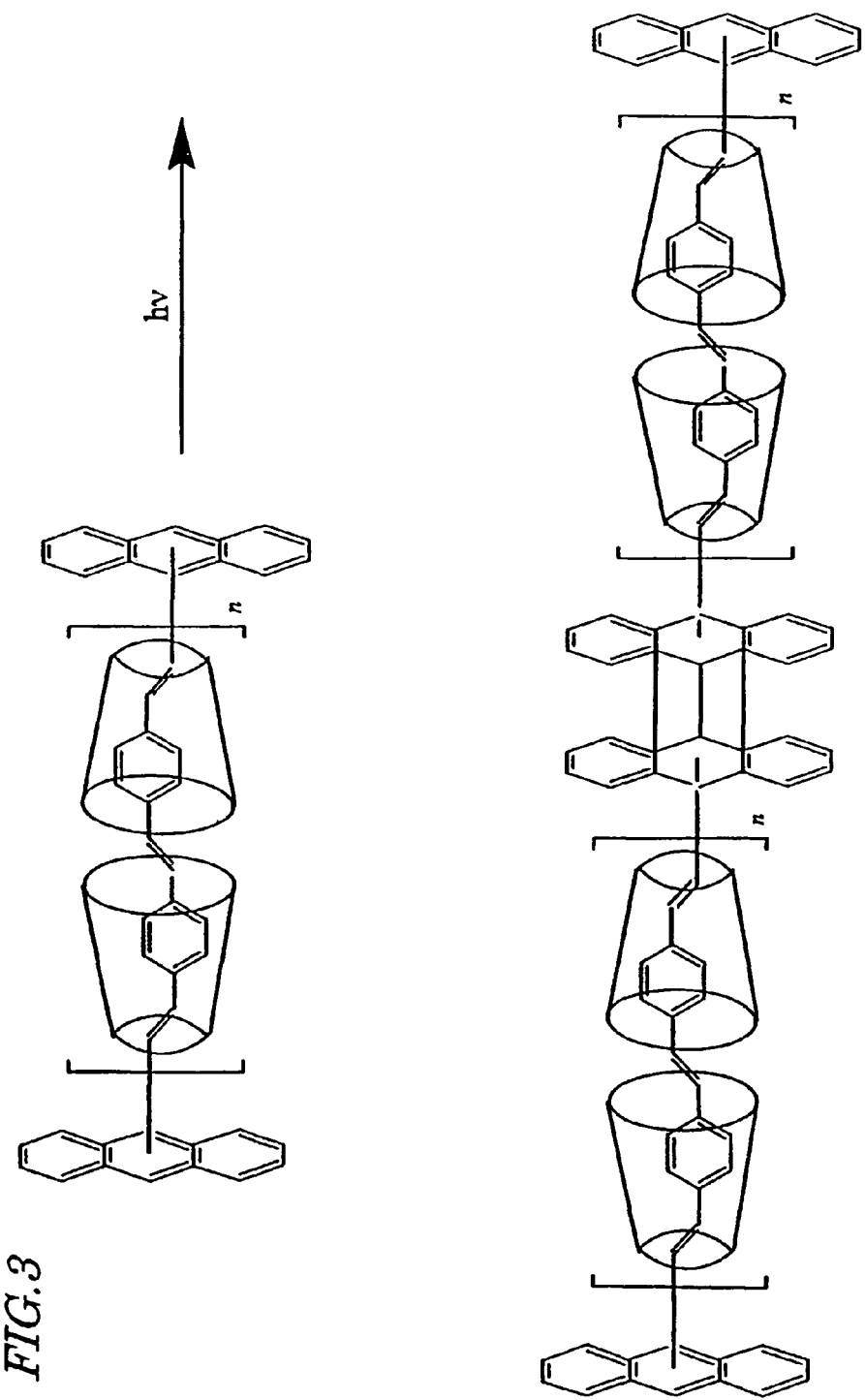
FIG. 3 schematically illustrates a dimerization reaction that is created by utilizing the reaction of the terminal groups of a polymer inclusion complex for use in a transistor according to a preferred embodiment of the present invention.

Also, as shown in FIG. 3, photo-reactive functional groups (e.g., anthracene in the example illustrated in FIG. 3) may be introduced into both terminals of each linear conductive polymer and the terminals of the linear polymers may be bonded with each other through a photo-reaction, for example. Then, the number of hopping sites can be further reduced. Accordingly, by introducing the terminal groups, even higher carrier mobility is achieved. Examples of preferred photo-reactive functional groups include anthracene and naphthalene that exhibit photo dimerization reaction.

Furthermore, since bulky terminal groups are introduced in this preferred embodiment, it is also possible to prevent the linear conductive polymers from being dissociated from the cavities of the cyclodextrin molecules. The size of each terminal group may be appropriately selected depending on the cavity size of the cyclodextrin molecule.

In the preferred embodiment described above, poly-p-phenylenevinylene is preferably used as an exemplary π conjugated linear polymer material having carrier conductivity. Examples of other preferred π conjugated polymer materials include poly(p-phenylene), polythiophene, poly(methoxy-(ethyl-hexoxy)-phenylenevinylene), poly(dialkoxy-phenylenevinylene) and poly(naphthalenevinylene). The degree of polymerization thereof is preferably at least 10, more preferably at least 20. Other suitable polymer materials may also be used.

An organic layer which can function as a semiconductor layer of the polymer inclusion complex may be formed by any of various known film deposition techniques. Generally speaking, a polymer inclusion complex is more soluble in a solvent than a conductive polymer itself. Accordingly, a solution of the polymer inclusion complex may be prepared by using any of various solvents. A film of the polymer inclusion complex may be formed on a substrate by applying or printing the solution of the polymer inclusion complex on the substrate by a spin coating technique, a dip coating technique, a casting technique, a printing technique or an inkjet printing technique and then drying and heating (if necessary) the applied or printed material. Alternatively, the organic layer may be formed on a supporting structure and then transferred from the supporting structure onto the substrate.

Hereinafter, a transistor including an organic layer of the polymer inclusion complex according to a specific preferred embodiment of the present invention will be described. In the following illustrative preferred embodiment of the present invention, a field effect transistor (FET) will be described as an exemplary active component for an active-matrix-addressed display device. It should be noted, however, that the present invention is not limited to an FET but is broadly applicable for use in any other type of transistor.

Figure 4:
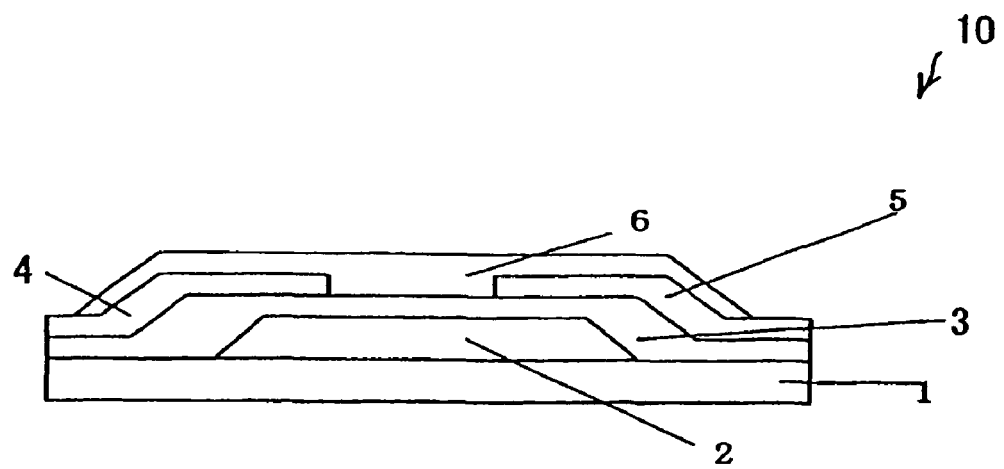
FIG. 4 is a cross-sectional view schematically illustrating a field effect transistor 10 according to a specific preferred embodiment of the present invention.

FIG. 4 is a cross-sectional view schematically illustrating an FET 10 of a bottom-gate type according to a preferred embodiment of the present invention. However, the present invention is not limited thereto and can be applied to any type of transistors including a bottom-gate type, a top-gate type, and a planar type (i.e., a non-stacked arrangement in which source, gate and drain electrodes are arranged side by side in a common same layer). As shown in FIG. 4, the FET 10 includes a gate electrode 2 on an insulating substrate 1, a gate insulating layer 3 that covers the gate electrode 2, source and drain electrodes 4 and 5 on the gate insulating layer 3, and a semiconductor layer (an organic layer) 6 provided between the source and drain electrodes 4 and 5. The semiconductor layer 6 also partially overlaps with the source and drain electrodes 4 and 5.

The FET 10 may be fabricated in the following manner, for example.

First, a gate electrode 2 is formed on an insulating substrate 1. Examples of preferred materials for the gate electrode 2 include inorganic materials such as Cr, Al, Ta, Mo, Nb, Cu, Ag, Au, Pt, Pd, In, Ni, Nd, an alloy thereof, polysilicon, amorphous silicon, tin oxide, indium oxide and indium tin oxide (ITO) and organic materials such as a doped conductive polymer. The doped conductive polymer may be a mixture of polyethylenedioxythiophene (PEDOT) and polystyrenesodium sulfonate. The gate electrode 2 may preferably include a stack of two or more layers. Specifically, a conductive film is deposited on the substrate 1 by any of various known film deposition techniques including evaporation, sputtering, coating and printing techniques, an appropriate one of which is selected according to the material adopted. Thereafter, the conductive film deposited is patterned into a predetermined shape by photolithographic and etching processes, thereby forming the gate electrode 2.

Next, a gate insulating layer 3 is formed so as to cover the gate electrode 2. Examples of preferred materials for the gate insulating layer 3 include inorganic materials such as $SiO_2$, SiN and $Al_2O_3$ and polymer materials such as polychloropyrenepolyethylene terephthalate, polyoxymethylene, polyvinylchloride, polyvinylidenefluoride, polymethyl methacrylate, polycarbonate, polyimide, polysulfone, and polyorganosiloxane. The gate insulating layer 3 may also include a stack of two or more layers and may also be deposited by any of various known film deposition techniques and then patterned if necessary.

Subsequently, source and drain electrodes 4 and 5 are formed on the gate insulating layer 3. The source and drain electrodes 4 and 5 may be made of the same material, and formed by the same method, as the gate electrode 2. Alternatively, the source and drain electrodes 4 and 5 may also be made of a different material from the gate electrode 2. Each of the source and drain electrodes 4 and 5 may also be a stack of two or more layers.

Thereafter, an organic semiconductor layer 6 including a polymer inclusion complex is formed. As described above, the semiconductor layer 6 including the polymer inclusion complex may be formed by preparing a solution of the polymer inclusion complex, applying or printing the solution on the source and drain electrodes 4 and 5 by any of the techniques enumerated above, drying the applied or printed material, and then heating it if necessary.

The FET 10 shown in FIG. 4 is completed preferably in this manner. In the illustrative preferred embodiment of the present invention described above, the FET 10 is a bottom-gate-type transistor. Alternatively, the present invention is also effectively applicable for use to fabricate an FET of a top-gate type or a non-stacked FET such as a planer type in which the source, gate and drain electrodes are arranged side by side in the same layer.

The semiconductor layer of the organic FET according to various preferred embodiments of the present invention includes the polymer inclusion complexes as described above, and has high carrier mobility. Also, the semiconductor layer is much less affected by oxygen or water in the air, and exhibits high stability, high reliability and high durability. Furthermore, since the polymer inclusion complexes are aligned to be substantially parallel or parallel to each other, the semiconductor layer exhibits conductivity and anisotropy. Optionally, an undercoat layer for the semiconductor layer may be subjected to an alignment treatment so that the polymer inclusion complexes in the resultant semiconductor layer will be aligned in the gate length direction. Then, the carrier mobility of the semiconductor layer can be increased very significantly.

Furthermore, this semiconductor layer can be formed by simply applying or printing a solution including the polymer inclusion complexes and does not have to be processed at an elevated temperature. Accordingly, the semiconductor layer can be easily formed even on a plastic substrate.

Furthermore, by selecting an appropriate type of conductive polymer for the polymer inclusion complex or by adequately increasing the doping level thereof, a film that has conductivity high enough to be an electrode may also be formed. Accordingly, each of the gate, source and drain electrodes 2, 4 and 5 may be formed of the film including the polymer inclusion complexes.

In the conventional conductive polymer used as an electrode material, side chains of a phthalocyanine derivative, an azo compound derivative, a perylene derivative, a quinacridon derivative, a polycyclic quinone derivative, a cyanine derivative, a fullerene derivative, a nitrogen-containing cyclic compound derivative such as indole or carbazole, a hydrazone derivative, a triphenylamine derivative or a polycyclic aromatic compound derivative are introduced into a main chain such as a polystyrene chain, a polysiloxane chain, a polyether chain, a polyester chain, a polyamide chain or a polyimide chain. Examples of other known conductive polymers include: conjugated polymer chains such as an aromatic conjugated polymer (e.g., poly(p-phenylene)), an aliphatic conjugated polymer (e.g., polyacetylene), a heterocyclic conjugated polymer (e.g., polypyrrole or polythiophene) and a hetero-atom-containing conjugated polymer (e.g., polyaniline or polyphenylene sulfide); carbon-type conjugated polymers such as a complex conjugated polymer having a structure in which multiple constituent units of the conjugated polymers are linked together (e.g., poly(phenylenevinylene), poly(arylenevinylene) or poly(thenylenevinylene)); polysilanes; disilanylene polymers; and disilanylene-carbon conjugated polymer structures.

The FET according to preferred embodiments of the present invention described above can be used effectively in a liquid crystal display device or an organic EL display device, or other display devices including a transistor. For example, in fabricating a display device, a pixel electrode to be connected to the drain electrode 5 of the FET 10 needs to be formed. In a transmissive liquid crystal display device, the pixel electrode may be formed by patterning a transparent conductive film of a tin oxide, an indium oxide or ITO. In a reflective liquid crystal display device on the other hand, the pixel electrode may be formed of a metal film of Al or Ag. Also, in an organic EL display device, the pixel electrode may be formed of a metal film of Mg, Ca, Al or Au. The pixel electrode is preferably made of the same material as the source and drain electrodes because the pixel, source and drain electrodes all can be formed in the same manufacturing process step in that case. When the pixel electrode is made of a different material from that of the source and drain electrodes, the pixel electrode may be formed either before or after the source and drain electrodes.

By using the FET according to the above-described preferred embodiment of the present invention, an active-matrix-addressed display device such as a liquid crystal display device or an organic EL display device can be manufactured at a greatly reduced cost. The transistor according to preferred embodiments of the present invention is applicable for use in any of various other types of electronic apparatuses.

Hereinafter, it will be described how to synthesize a polymer inclusion complex to be preferably used in the semiconductor layer of the transistor according to a preferred embodiment of the present invention.

A linear conductive polymer may be included in a cyclodextrin molecule by a conventional method. Specifically, an inclusion complex may be formed just by dissolving a cyclodextrin compound in a predetermined solvent, stirring the mixture and then adding a linear conductive polymer to the mixture. The stirring process step is preferably performed at a temperature that is within the range from approximately room temperature to about 70° C., more preferably from about 20° C. to about 40° C. Various cyclodextrin compounds are readily available. For example, a cross-linked cyclodextrin polymer may be synthesized by the method disclosed in Japanese Laid-Open Publication No. 10-195108 identified above.

Figure 5:
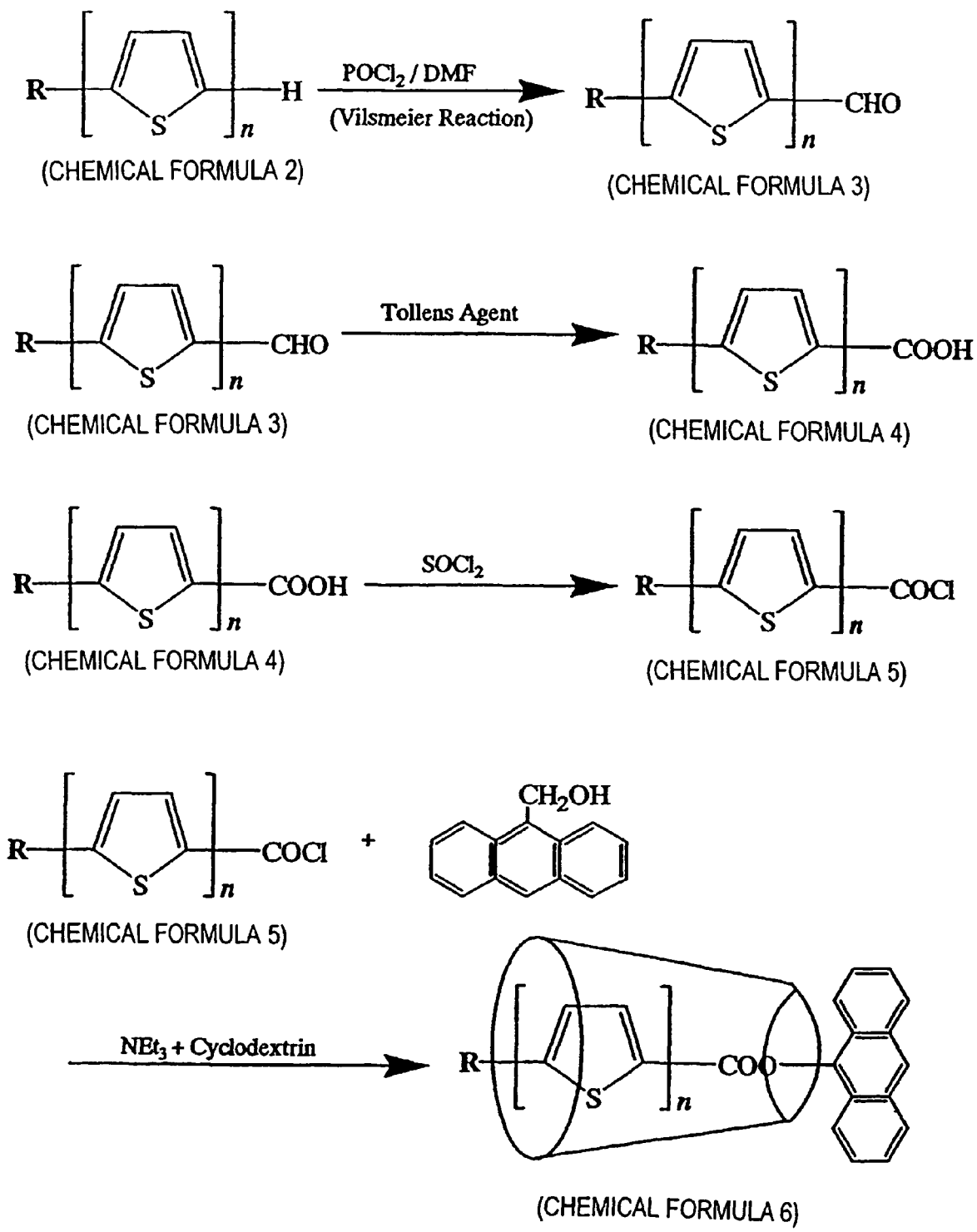
FIG. 5 shows how to synthesize a polymer inclusion complex, including a capped terminal group, for use in the transistor shown in FIG. 4.

Hereinafter, it will be described with reference to FIG. 5 how to synthesize a polymer inclusion complex in which a photo-reactive functional group is introduced into the terminal of a linear conductive polymer. In this specific example, polythiophene is used as the conductive polymer.

First, polythiophene represented by Chemical Formula (2) is turned into a formyl (or aldehyde) through a Vilsmeier reaction, thereby obtaining a compound represented by Chemical Formula (3). When the compound represented by Chemical Formula (3) is oxidized with a Tollens reagent (i.e., silver ammonium ions), polythiophene represented by Chemical Formula (4), including a terminal that has been modified with a carboxyl group, can be obtained.

Furthermore, when the carboxyl group of the polythiophene represented by Chemical Formula (4) is reacted with a reagent such as thionyl chloride, an acid chloride can be obtained as represented by Chemical Formula (5). Next, the acid chloride of the polythiophene represented by Chemical Formula (5) is included in cyclodextrin and then the resultant complex is reacted with anthracene methanol, thereby obtaining polythiophene including an anthracene terminal group as represented by Chemical Formula (6).

When the polymer inclusion complex represented by Chemical Formula (6) is exposed to a radiation having a particular wavelength, the photo-dimerization reaction of anthracene occurs. As a result, a cylindrical polymer inclusion complex having an increased conjugate length can be obtained as shown in FIG. 3.

In the preferred synthesis example described above, polythiophene is used as the conductive polymer. However, the terminal of any other conductive polymer such as polyphenylene, polyphenylenevinylene or polyfluorene may also be modified through a similar synthesis procedure.

Hereinafter, it will be described specifically how to fabricate an organic thin-film transistor 10 having the reverse staggered structure shown in FIG. 4. In this specific example of preferred embodiments of the present invention, the gate electrode 2 may preferably be made of Ta, the source and drain electrodes 4 and 5 may preferably be made of Al, and the organic semiconductor layer 6 may be made of any of various polymer inclusion complexes in which polythiophene is included in a cyclodextrin compound.

The transistor 10 may preferably be fabricated in the following manner.

(1) Ta is deposited on a substrate 1 by an evaporation process using a mask, thereby forming a gate electrode 2 on the substrate 1.

(2) The surface of the gate electrode 2 is oxidized to form a gate insulating layer 3 thereon.

(3) Aluminum is deposited on the gate insulating layer 3 by an evaporation process using a mask, thereby forming source and drain electrodes 4 and 5. In this process step, the gap between the source and drain electrodes 4 and 5 is adjusted so that the transistor 10 will have a channel length of approximately 12 μm, for example.

(4) A solution including the polymer inclusion complexes is applied onto a predetermined portion by an inkjet printing technique and then dried, thereby forming an organic semiconductor layer 6. The organic semiconductor layer 6 may include at least one molecular layer and preferably has a thickness of about 100 nm to about 1,000 nm.

If a polymer inclusion complex, in which polythiophene represented by Chemical Formula (2) is included in cyclodextrin represented by Chemical Formula (1) (where n=7), is used, the organic thin-film FET 10 can have as high a carrier mobility as about 0.3 $cm^2 V^{-1} s^{-1}$. The carrier mobility may be measured by a time-of-flight method, for example. Also, the current-voltage characteristic of the organic thin-film FET 10 may be represented by an ON-state/OFF-state current ratio of approximately 7 digits. The carrier mobility and ON-state/OFF-state current ratio of the FET 10 are comparable to those of a currently available a-Si transistor. Furthermore, the lifetime of this organic thin-film FET 10 can be at least five times as long as that of the conventional organic FET including a semiconductor layer that essentially consists of polythiophene represented by Chemical Formula (2). The organic thin-film FET 10 may have a lifetime of greater than 10,000 hours, for example. It should be noted that the conventional organic FET including such a semiconductor layer consisting essentially of polythiophene (Chemical Formula (2)) normally has a carrier mobility of about $8.5 \times 10^{-5}$ $cm^2 V^{-1} s^{-1}$ and an ON-state/OFF-state current ratio of approximately 3 digits.

If the cyclodextrin compound of the polymer inclusion complex is replaced with a cross-linked cyclodextrin polymer (see FIG. 1B), then the carrier mobility can be further increased (to about 0.8 $cm^2 V^{-1} s^{-1}$, for example).

Also, if the terminal of the polythiophene (or polythiophene chain) of the polymer inclusion complex is capped with anthracene, then an even higher carrier mobility of about 1.3 $cm^2 V^{-1} s^{-1}$ is achieved. Furthermore, if this anthracene terminal group is subjected to photo-dimerization reaction, the carrier mobility can be further increased to about 8.5 $cm^2 V^{-1} s^{-1}$.

Figure 6:
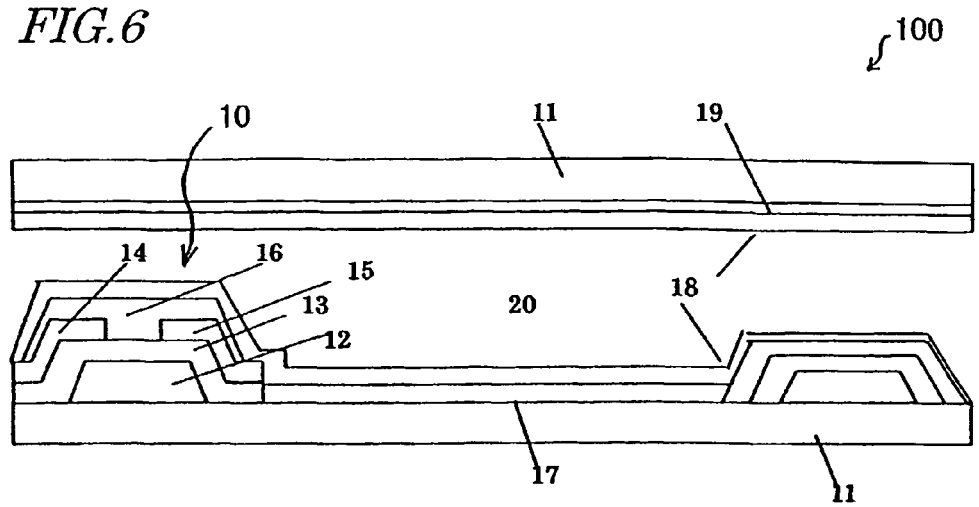
FIG. 6 is a cross-sectional view schematically illustrating a liquid crystal display device 100 according to another specific preferred embodiment of the present invention.

Next, a liquid crystal display device 100 including the transistor according to preferred embodiments of the present invention will be described. FIG. 6 is a cross-sectional view schematically illustrating the liquid crystal display device 100. This liquid crystal display device 100 is a typical TN-mode TFT liquid crystal display device. The liquid crystal display device 100 has the same structure as the conventional one except that the TFT of this liquid crystal display device 100 is the FET 10 including the semiconductor layer made of polymer inclusion complexes. Thus, the liquid crystal display device 100 may be fabricated by a known method except for formation of the semiconductor layer made of polymer inclusion complexes.

As shown in FIG. 6, the FET 10, including the gate electrode 12, gate insulating layer 13, source and drain electrodes 14 and 15 and organic semiconductor layer 16, is provided on a glass substrate 11. A pixel electrode 17 made of ITO is connected to the drain electrode 15 of the FET 10. On another glass substrate 11 that is provided as a counter substrate, a counter electrode 19 of ITO is provided. The inside surfaces of these substrates 11, which are in contact with a liquid crystal layer 20, are entirely covered with alignment films 18. In the liquid crystal layer 20, liquid crystal molecules are aligned in a twisted nematic fashion by the alignment films 18. In this preferred embodiment, the liquid crystal layer 20 is preferably made of a nematic liquid crystal material having positive dielectric anisotropy and the alignment films 18 are preferably made of polyimide to define a pretilt angle of about 2 degrees.

This liquid crystal display device 100 may be driven at an applied voltage of about 4 V. As described above, the transistor according to the preferred embodiment of the present invention has a higher carrier mobility and a greater ON-state/OFF-state current ratio than the conventional a-Si transistor, and therefore can have a greatly reduced size. Thus, the aperture ratio may be increased from about 65% of the conventional a-Si TFT to approximately 85%. Accordingly, when a cold-cathode tube backlight is used, the resultant luminance can be increased from about 300 Cd of the conventional TFT to about 500 Cd. Furthermore, since the ON-state/OFF-state current ratio is much higher than that of the conventional a-Si TFT, the conventional front contrast ratio of about 300:1 can be increased to about 500:1. As a result, the viewing angle characteristics are also improved. Specifically, the viewing angle ranges resulting in contrast ratios of about 10:1 or more are defined at about 80 degrees or more both vertically and horizontally alike.

As can be seen, by using the FET according to preferred embodiments of the present invention, the liquid crystal display device achieves greatly enhanced performance. Also, since the FET can be manufactured by a simplified process, the liquid crystal display device can also be fabricated at a reduced manufacturing cost. It should be noted, however, that the FET according to preferred embodiments of the present invention is applicable not just to the liquid crystal display device described above but also to any of various other types of liquid crystal display devices and other display devices.

Figure 7:
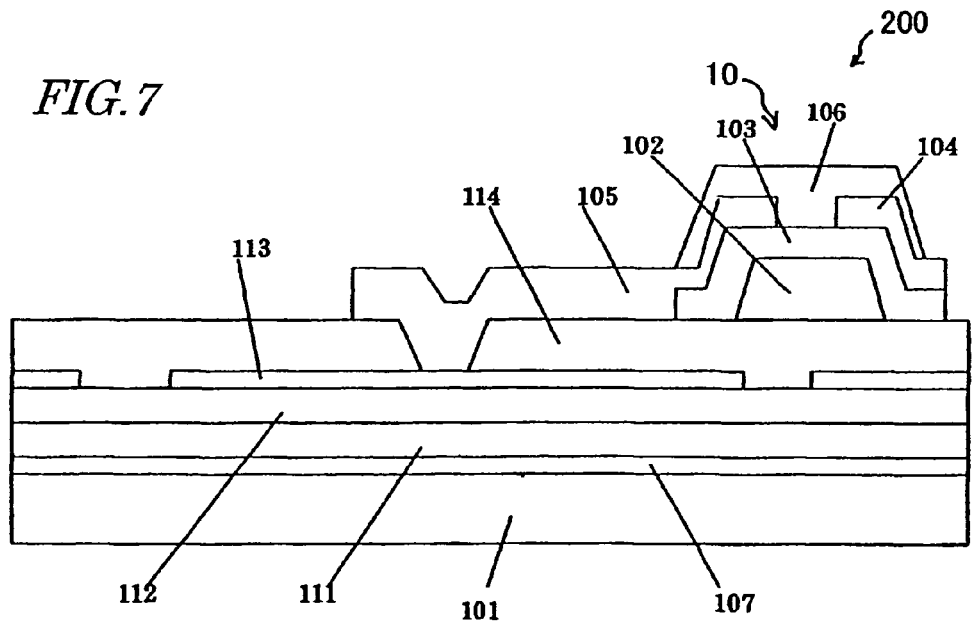
FIG. 7 is a cross-sectional view schematically illustrating an organic EL display device 200 according to still another specific preferred embodiment of the present invention.

Hereinafter, an organic EL display device 200 including the transistor according to preferred embodiments of the present invention will be described. FIG. 7 is a cross-sectional view schematically illustrating the organic EL display device 200. This organic EL display device 200 is a typical TFT organic EL display device and preferably has the same structure as the conventional one except that the TFT of this organic EL display device 200 is the FET 10 including the semiconductor layer of polymer inclusion complexes according to a preferred embodiment of the present invention described above. As noted above, the FET 10 includes a gate electrode 102, a gate insulating layer 103, a source electrode 104, a drain electrode 105, and an organic semiconductor layer 106. Thus, the organic EL display device 200 may be fabricated by a known method except for formation of the semiconductor layer including an organic layer made of polymer inclusion complexes.

In the organic EL display device 200, an electroluminescence layer 111 and a hole transport layer 112 are stacked in this order over a transparent substrate 101 that is covered with an transparent electrode 107 of ITO. On the hole transport layer 112, multiple pixel electrodes 113 are arranged in a matrix configuration. An FET 10 is electrically connected to each of the pixel electrodes 113 by way of the drain electrode 105 of the FET 10.

This organic EL display device 200 can have a high aperture ratio on its emission plane, because the emission plane can be defined without depending on the size of the FETs 10. Also, an interlevel dielectric layer 114, which is provided between the pixel electrodes 113 and the FETs 10, can function as a planarizing layer. Accordingly, when a full-color display device is fabricated, the FETs 10 of respective pixels can be formed on the flat layer 114.

This organic EL display device 200 can be driven at a source voltage of about 5 V and at a gate voltage of about 5 V. Also, this organic EL display device 200 can emit electroluminescence with an intensity of about 7,000 Cd/m$^2$, which is significantly higher than the conventional electroluminescence intensity of about 2,000 Cd/m$^2$ to about 3,000 Cd/m$^2$. Furthermore, this organic EL display device 200 can also display a moving picture thereon.

Furthermore, if the electroluminescence layer 111 is formed as a striped arrangement of red, green and blue emission layers, then a color display device can be provided. When this color display device is operated to present a moving picture thereon at a source voltage of about 5 V and at a gate voltage of about 5 V, for example, the resultant electroluminescence intensity can be increased from about 1,000-1,500 Cd/m$^2$ of the conventional display device to about 3,000 Cd/M$^2$. In addition, since the ON-state/OFF-state current ratio of the FET 10 is much higher than that of the conventional a-Si TFT, the front contrast ratio can be increased from the conventional ratio of about 300:1 to approximately 550:1.

As can be seen, by introducing the FET according to preferred embodiments of the present invention, the organic EL display device achieves greatly enhanced performance. Also, since the FET can be manufactured by a simplified process, the organic EL display device can also be fabricated at a reduced manufacturing cost. It should be noted, however, that the FET according to the preferred embodiment of the present invention is applicable not just to the organic EL display device described above but also to any of various other types of organic EL display devices.

The transistor according to the preferred embodiments of the present invention described above is preferably a reverse-staggered FET 10. Alternatively, a planar FET may also be used.

Figure 8A:
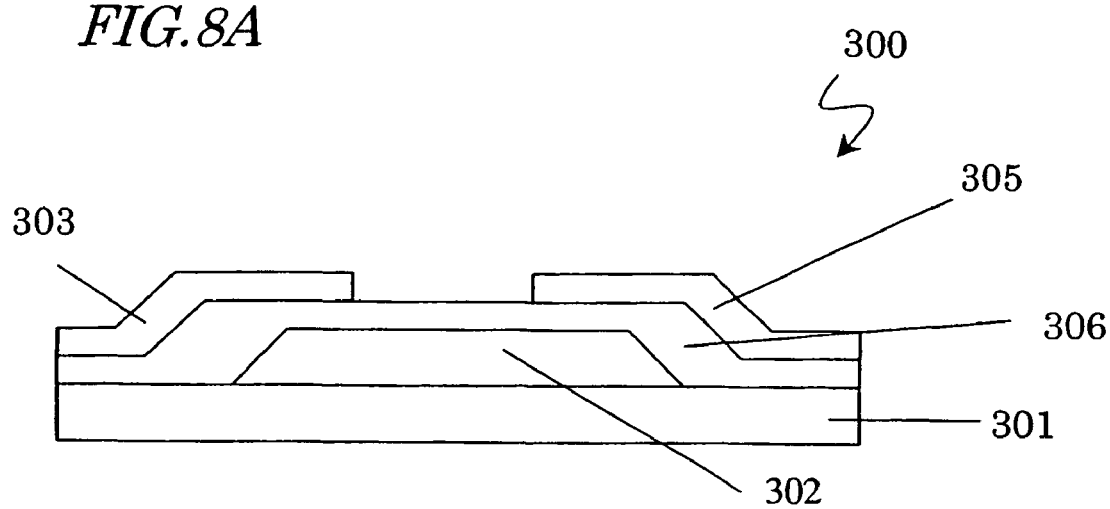
FIG. 8A is a cross-sectional view schematically illustrating a field effect transistor 300 according to another specific preferred embodiment of the present invention.

In addition to the various structures of the different displays described above, other arrangements of a transistor, for use, for example, in a display device, including an organic layer including a polymer inclusion complex are possible. FIG. 8A is a cross-sectional view schematically illustrating an FET 300 of a bottom-gate type according to yet another preferred embodiment of the present invention. However, the present invention is not limited thereto and can be applied to any type of FET or other transistor including a top-gate type FET and other transistors. As shown in FIG. 8A, the FET 300 includes a gate electrode 302 on an insulating substrate 301. Unlike the conventional devices and the other preferred embodiments described above, this FET 300 does not include a gate insulating layer that covers the gate electrode 302. Instead, an organic layer 306 including a polymer inclusion complex is formed on the gate electrode 302 so as to cover the gate electrode 302. The source and drain electrodes 304 and 305 are formed on the organic layer 306. The organic layer 306 has the functions of a semiconductor layer and a gate insulating layer. The organic layer 306 may be a monolayer of the inclusion complex or a single molecule of the inclusion complex.

The FET 300 may be fabricated in the following manner, for example.

First, a gate electrode 302 is formed on an insulating substrate 301. Examples of preferred materials for the gate electrode 302 include inorganic materials such as Cr, Al, Ta, Mo, Nb, Cu, Ag, Au, Pt, Pd, In, Ni, Nd, an alloy thereof, polysilicon, amorphous silicon, tin oxide, indium oxide and indium tin oxide (ITO) and organic materials such as a doped conductive polymer. The doped conductive polymer may be a mixture of polyethylenedioxythiophene (PEDOT) and polystyrenesodium sulfonate. The gate electrode 302 may preferably include a stack of two or more layers. Specifically, a conductive film is deposited on the substrate 301 by any of various known film deposition techniques including evaporation, sputtering, coating and printing techniques, an appropriate one of which is selected according to the material adopted. Thereafter, the conductive film deposited is patterned into a predetermined shape by photolithographic and etching processes, thereby forming the gate electrode 302.

Next, an organic layer 306 including a polymer inclusion complex is formed so as to cover the gate electrode 302. The organic layer 306 including the polymer inclusion complex may be formed by preparing a solution of the polymer inclusion complex, applying or printing the solution on the gate electrode 302 by any of the techniques enumerated above, drying the applied or printed material, and then heating the applied or printed material, if necessary.

Figure 8B:
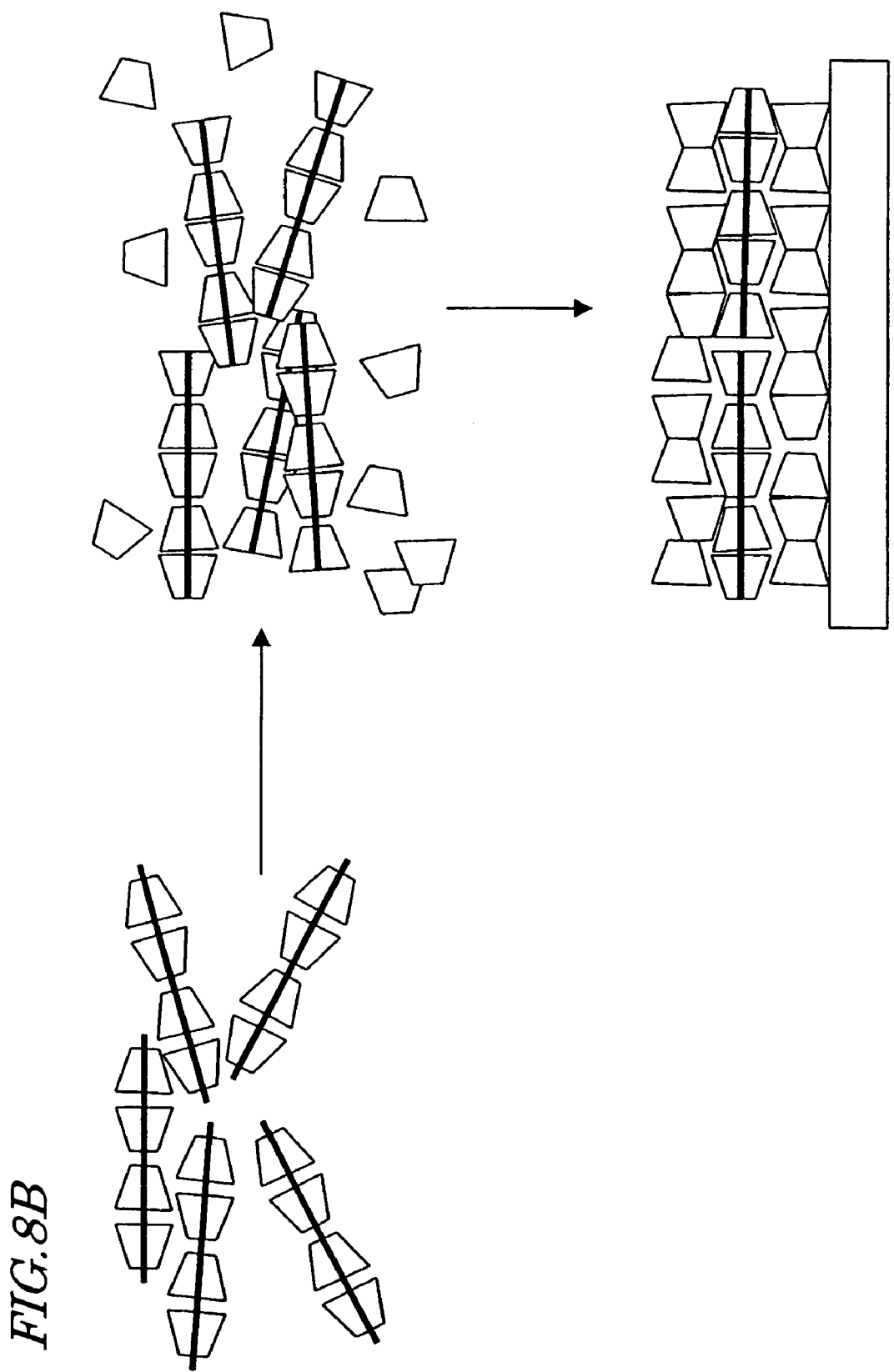
FIG. 8B shows how to form an organic layer including a polymer inclusion complex, for use in the transistor shown in FIG. 8A.

In the preparation of the solution of the polymer inclusion complex, preferably the host molecules (e.g., CD) in an excess amount are mixed with the guest molecules, as shown in FIG. 8B. By using the solution including the host molecules, which have an insulating property, in an excess amount, the guest molecules are more completely covered by the host molecules. In addition, the excess amount of the host molecules may form a layer which functions as a gate insulating layer. Therefore, in the formation of an organic layer that functions as a semiconductor layer and a gate insulating layer, the solution containing the host molecules in an excess amount is preferably used.

Subsequently, source and drain electrodes 304 and 305 are formed on the organic layer 306. The source and drain electrodes 304 and 305 may be made of the same material, and formed by the same method, as the gate electrode 302. Alternatively, the source and drain electrodes 304 and 305 may also be made of a different material from the gate electrode 302. Each of the source and drain electrodes 304 and 305 may also include a stack of two or more layers.

The FET 300 shown in FIG. 8A is completed preferably in this manner. In the illustrative preferred embodiment of the present invention described above, the FET 300 is a bottom-gate-type transistor. Alternatively, the present invention is also effectively applicable for use to fabricate an FET of a top-gate type or a non-stacked FET in which the source, gate and drain electrodes are arranged side by side in the same layer.

The structure and arrangement show in FIG. 8A can also be used in any type of transistor for use in, for example, any other of the displays disclosed herein or other suitable displays.

Other arrangements of the organic layer including a polymer inclusion complex and the gate, source and drain electrodes are possible.

Figure 9A:
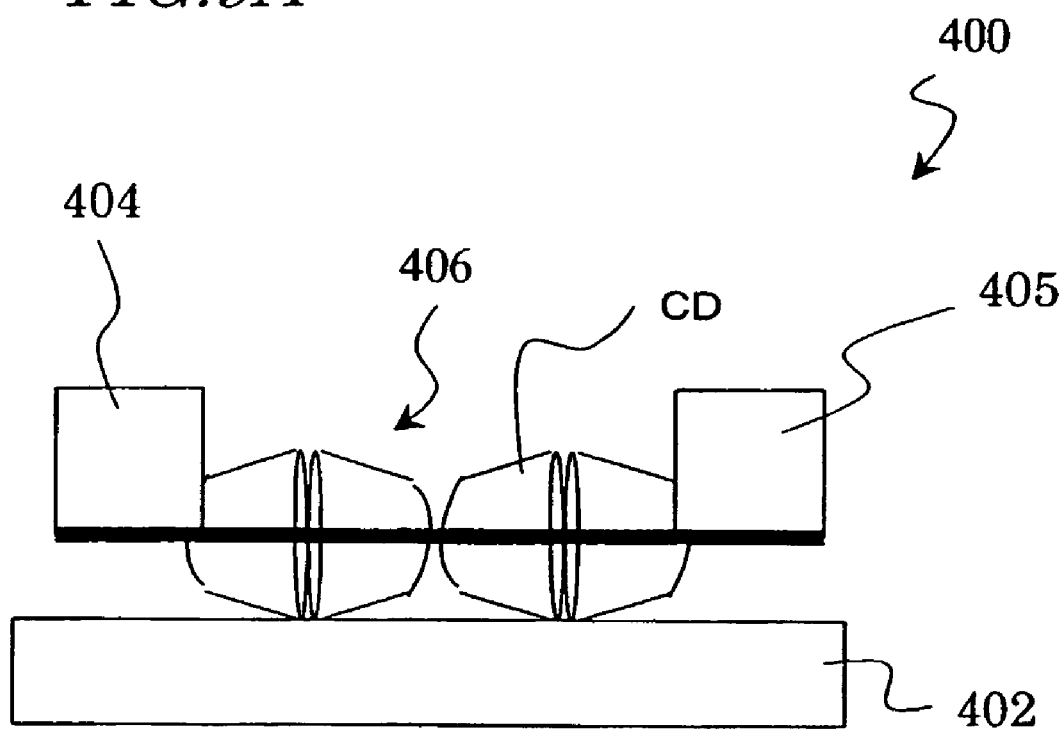
FIG. 9A schematically illustrates the structure of a portion of an FET 400 including another arrangement of an exemplary polymer inclusion complex.

FIG. 9A schematically illustrates the structure of a portion of an FET 400 including another arrangement of an exemplary polymer inclusion complex. In FIG. 9A, the process for forming and the arrangement of the organic layer 406 including the polymer inclusion complex, the gate electrode 402, the source electrode 404 and the drain electrode 405 are preferably similar to those of FIG. 8A, except that a portion of the insulated inclusion compound is removed such that the source electrode 404 and the drain electrode 405 are directly above and in electrical contact with the conducting polymer in the organic layer 406 including the polymer inclusion complex.

Figure 9B:
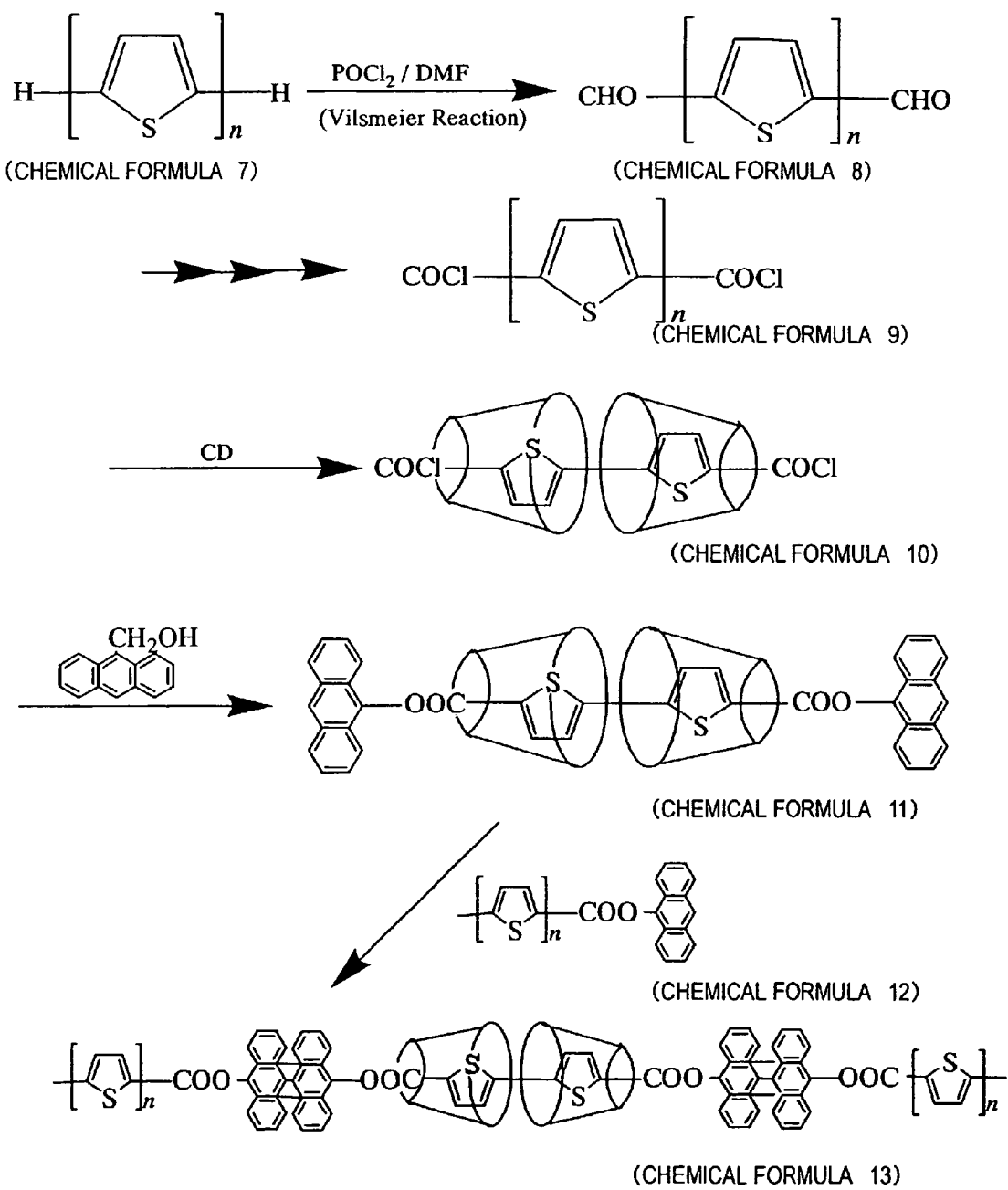
FIG. 9B shows how to synthesize a polymer inclusion complex, for use in the transistor shown in FIG. 9A.

A method for preparing the organic layer 406 will be described with reference to FIG. 9B. In this specific example, polythiophene is used as the conductive polymer.

First, polythiophene represented by Chemical Formula (7) is turned into a di-formyl (or di-aldehyde) through a Vilsmeier reaction, thereby obtaining a compound represented by Chemical Formula (8). When the compound represented by Chemical Formula (8) is oxidized with a Tollens reagent (i.e., silver ammonium ions), polythiophene having carboxyl groups, can be obtained. Furthermore, when the carboxyl group of the polythiophene is reacted with a reagent such as thionyl chloride, an acid chloride can be obtained as represented by Chemical Formula (9).

Next, the acid chloride of the polythiophene represented by Chemical Formula (9) is included in cyclodextrin to form a polymer inclusion complex represented by Chemical Formula (10). Then the resultant complex (10) is reacted with anthracene methanol, thereby obtaining polythiophene having an anthracene terminal group as represented by Chemical Formula (11).

When the mixture of the polymer inclusion complex represented by Chemical Formula (11) and polythiophene having an anthracene terminal group as represented by Chemical Formula (12) is exposed to a radiation having a particular wavelength, the photo-dimerization reaction of anthracene occurs. As a result, a cylindrical polymer inclusion complex having the conjugated polymer chain exposed at both ends of the polymer as represented by Chemical Formula (13) in FIG. 9B is produced.

Figure 10:
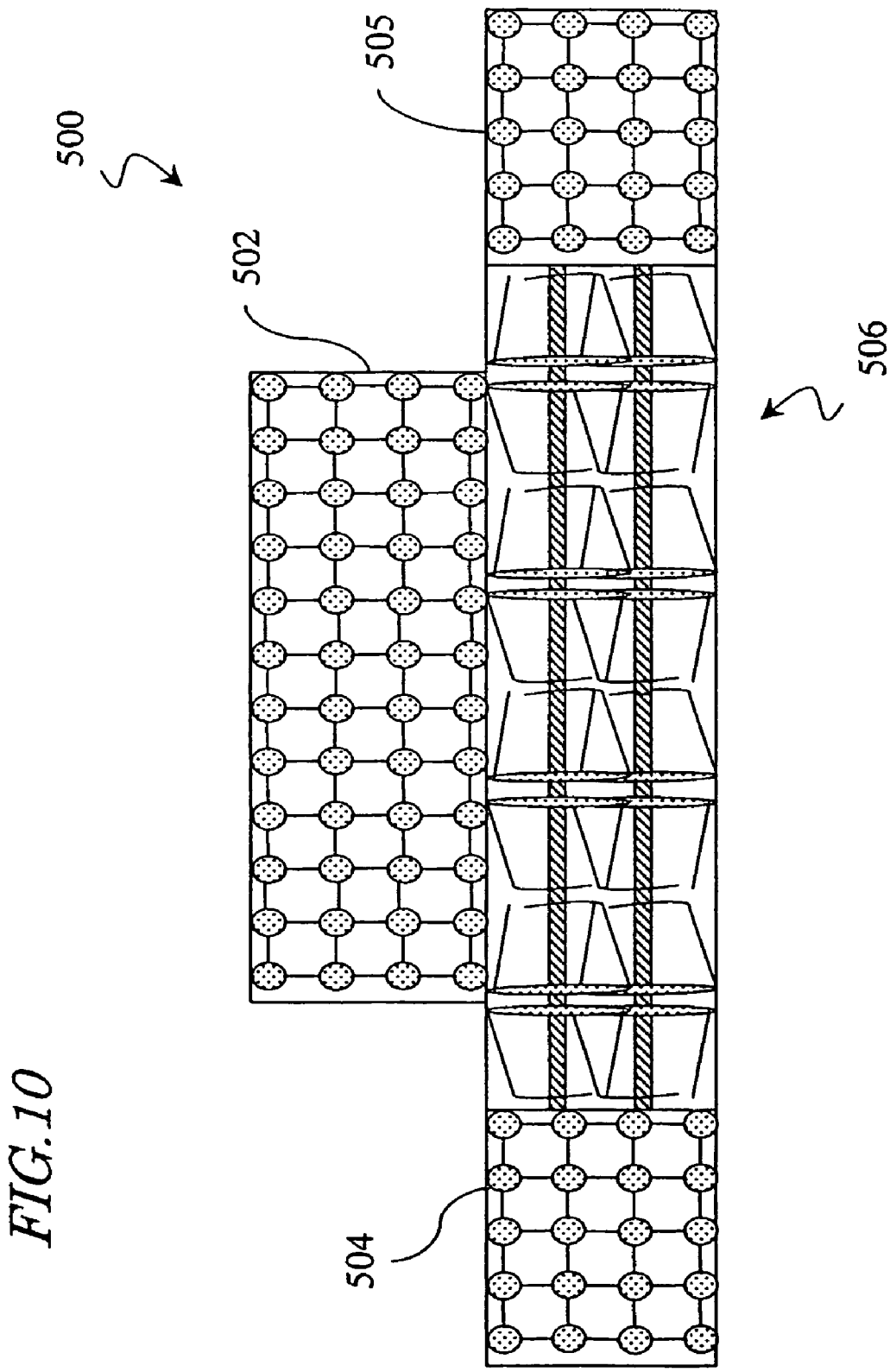
FIG. 10 schematically illustrates the structure of a portion of an FET 500 including another arrangement of an exemplary polymer inclusion complex.

FIG. 10 schematically illustrates the structure of a portion of an FET 500 including another arrangement of an exemplary polymer inclusion complex.

The structure shown in FIG. 10 is different from that shown in FIG. 8A in the arrangement of the source electrode 504 and the drain electrode 505 which provide electrical contact between the source electrode 504 and the drain electrode 505 and the conducting polymer in the organic layer 506 including the polymer inclusion complex. The gate electrode 502, the source electrode 504 and the drain electrode 505 are made of a metal crystal. The source electrode 504 and the drain electrode 505 are electrically connected to the conducting polymer, which is a gust molecule of the polymer inclusion complex, at the both ends of the polymer inclusion complex. The gate electrode 502 is insulated from the conducting polymer by the host molecule (e.g., CD) having an insulating property. As the polymer inclusion complex, the polymer inclusion complex having the conjugated polymer chain exposed at both ends of the polymer as represented by Chemical Formula (13) in FIG. 9B is preferably used.

The top-gate type structure shown in FIG. 10 may be formed as follows, for example. The source electrode 504 and the drain electrode 505 may be formed on a substrate (not shown) by any of various known film deposition techniques and patterning techniques. After forming the organic layer 506 in the same manner as described with reference FIG. 8A, the gate electrode 502 may be formed on the organic layer 506 by an inkjet technique, for example. The process for forming and the arrangement of the organic layer 506, the gate electrode 502, the source electrode 504 and the drain electrode 505 may be similar to those of FIG. 8A.

Figure 11:
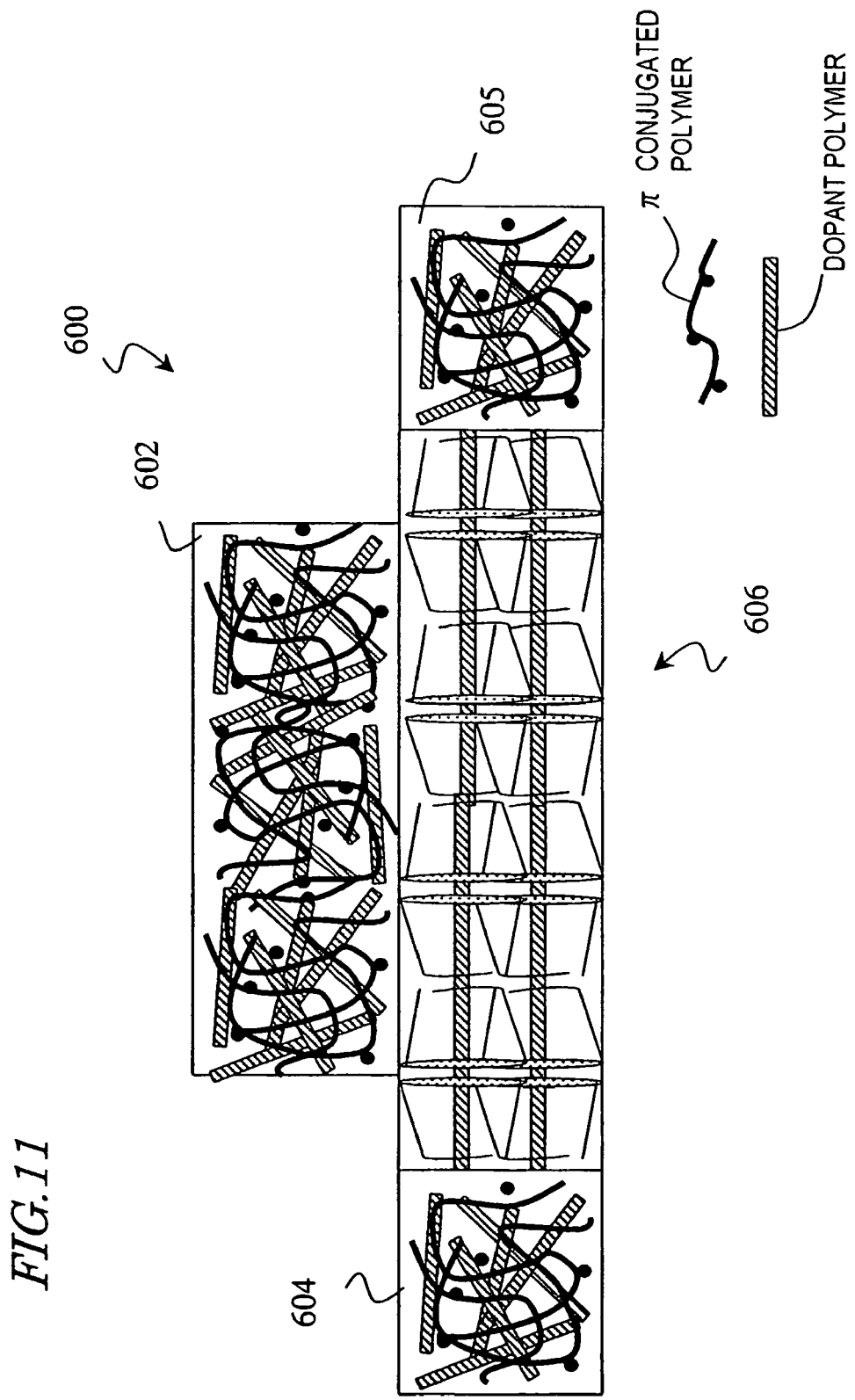
FIG. 11 schematically illustrates the structure of a portion of an FET 600 including another arrangement of an exemplary polymer inclusion complex.

FIG. 11 schematically illustrates the structure of a portion of an FET 600 including another arrangement of an exemplary polymer inclusion complex.

The structure shown in FIG. 11 is different from that shown in FIG. 8A in the arrangement of the source electrode 604 and the drain electrode 605 which provide electrical contact between the source electrode 604 and the drain electrode 605 and the conducting polymer in the organic layer 606 including the polymer inclusion complex. The gate electrode 602, the source electrode 604 and the drain electrode 605 are made of a conventional conducting polymer (mixture of a π conjugated polymer and a dopant polymer). The source electrode 604 and the drain electrode 605 are electrically connected to the conducting polymer, which is a gust molecule of the polymer inclusion complex, at the both ends of the polymer inclusion complex. The gate electrode 602 is insulated from the conducting polymer by the host molecule (e.g., CD) having an insulating property. As the polymer inclusion complex, the polymer inclusion complex having the conjugated polymer chain exposed at both ends of the polymer as represented by Chemical Formula (13) in FIG. 9B is preferably used.

The top-gate type structure shown in FIG. 11 may be formed as follows, for example. The source electrode 604 and the drain electrode 605 may be formed on a substrate (not shown) by any of various known film deposition techniques and patterning techniques. After forming the organic layer 606 in the same manner as described with reference FIG. 8A, the gate electrode 602 may be formed on the organic layer 606 by an inkjet technique, for example. The process for forming and the arrangement of the organic layer 606, the gate electrode 602, the source electrode 604 and the drain electrode 605 may be similar to those of FIG. 8A.

With the unique arrangements shown in preferred embodiments illustrated in FIGS. 8A, 9A, 10 and 11, several significant advantages are achieved. As is clear from the above description, no gate insulating layer is used or formed in any of the preferred embodiments of FIGS. 8A, 9A, 10 and 11. This is because the organic layer including the polymer inclusion complex has insulated compounds surrounding a conducting polymer and therefore can be disposed so as to cover the gate electrode and between the gate electrode and the source and drain electrodes. As a result, the number of manufacturing steps is reduced and the cost of the transistor is also reduced.

Furthermore, the preferred embodiments shown in FIGS. 8A, 9A, 10 and 11 eliminate the need to control the ratio and surface condition between a thickness of the gate insulating layer and the thickness of the semiconductor layer as with conventional transistors. As a result, the preferred embodiments shown in FIGS. 8A, 9A, 10 and 11 have greatly improved current-voltage and On-Off ratios, as well as greatly increased carrier mobility as described above. For example, in the case where polythiophene covered by non-cross-linked CD molecules are used, an On-Off ratio in the order of $10^4$ is obtained. The On-Off ratio is further improved to the order of $10^6$ by using cross-linked CD molecules.

Furthermore, with the unique structure of the preferred embodiments shown in FIGS. 8A, 9A, 10 and 11, the transistor can have dimensions in the nanometer range, thus providing a nanoscale organic transistor with greatly improved characteristics as compared to conventional transistors. For example, the dimensions of the organic layer including a polymer inclusion complex shown in FIGS. 8A, 9A, 10 and 11 may preferably have the dimensions of about 0.5 nm to about 10 nm in the thickness and about 1 nm to about 20 nm in the length (corresponding to the channel length).

The structure and arrangement shown in the preferred embodiments of FIGS. 8A, 9A, 10, and 11 can also be used in any type of transistor for use in, for example, any other of the displays disclosed herein or other suitable displays.

By using the transistors of the preferred embodiments shown in FIGS. 8A, 9A, 10 and 11 as transistors for a display device, the following advantages are achieved. The pixel aperture ratio of the display device can be increased significantly and the brightness of the display device can be increased. The pixel size of the display device can also be reduced and the resolution of the display device can be improved. Especially, an organic EL display device that is thinner than a liquid crystal display device can be obtained. Furthermore, a flexible display device (e.g., LCD or organic EL), which maintains higher performance while being deformed (e.g., bent or extended) than the conventional one having conventional transistors, can be obtained.

Various preferred embodiments of the present invention described above provide an organic transistor that has significantly improved characteristics and/or reliability as compared with the transistor that uses the conventional conductive polymer. A transistor according to any of the preferred embodiments of the present invention described above can be used effectively as an active component for an active-matrix-addressed display device. Also, the transistor according to the preferred embodiments of the present invention can exhibit performance that is at least comparable to, or even better than, that of the conventional a-Si TFT, and yet can be manufactured at a greatly reduced cost.

While the present invention has been described with respect to preferred embodiments thereof, it will be apparent to those skilled in the art that the disclosed inventions may be modified in numerous ways and may assume many embodiments other than those specifically described above. Accordingly, it is intended that the appended claims cover all possible modifications, variations, alterations and changes to the inventions that fall within the true spirit and scope of the present invention.

The invention claimed is:

1. A transistor comprising:
a first electrode;
a second electrode;
an organic layer which is provided between the first and second electrodes; and
a third electrode arranged to apply an electric field to the organic layer; wherein
the organic layer includes a polymer inclusion complex; and
the polymer inclusion complex has a guest polymer having electrical conductivity included in a host molecule.

2. The transistor of claim 1, wherein the host molecule includes a polymer having a cross-linked structure.

3. The transistor of claim 1, wherein at least one terminal of the guest polymer includes a bulky terminal group arranged to stabilize a state in which the guest polymer is included in the host molecule.

4. The transistor of claim 1, wherein the guest polymer has reactive terminal groups, the reactive terminal groups of adjacent guest polymers being bonded together.

5. The transistor of claim 1, wherein the guest polymer is a π conjugated polymer, and wherein the terminal group and the guest polymer form a π conjugated system.

6. The transistor of claim 1, wherein the guest polymer is a linear polymer.

7. The transistor of claim 1, wherein the host molecule is a cylindrical host molecule.

8. The transistor of claim 7, wherein the cylindrical host molecule is one of a low-molecular-weight compound and a high-molecular-weight compound.

9. The transistor of claim 1, wherein the guest polymer has a degree of polymerization that is at least 10 to 200.

10. The transistor of claim 1, wherein the transistor is a field effect transistor.

11. The transistor of claim 10, wherein the field effect transistor has one of a bottom-gate arrangement, a top-gate arrangement, and a planar arrangement.

12. The transistor of one of claim 1, wherein the transistor is a nanoscale organic transistor.

13. A display device comprising:
the transistor according to claim 1; and
a pixel connected to the transistor.

* * * * *